(12) United States Patent
Williams et al.

(10) Patent No.: US 12,507,370 B2
(45) Date of Patent: Dec. 23, 2025

(54) BACK INTERFACE FOR RACK SHELF

(71) Applicant: Intel Corporation, Santa Clara, CA (US)

(72) Inventors: Carl D. Williams, Manitou Springs, CO (US); Steven C. Miller, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 784 days.

(21) Appl. No.: 17/540,936

(22) Filed: Dec. 2, 2021

(65) Prior Publication Data

US 2023/0180421 A1 Jun. 8, 2023

(51) Int. Cl.
*H05K 7/14* (2006.01)

(52) U.S. Cl.
CPC ......... *H05K 7/1492* (2013.01); *H05K 7/1491* (2013.01)

(58) Field of Classification Search
CPC ............... H05K 7/1492; H05K 7/1491; H05K 7/20272; H05K 7/20781
See application file for complete search history.

(56) References Cited

U.S. PATENT DOCUMENTS

| | | | |
|---|---|---|---|
| 10,985,578 B1 | 4/2021 | Ardaman et al. | |
| 2007/0081308 A1 | 4/2007 | Ishida | |
| 2012/0092835 A1* | 4/2012 | Miller | H01R 4/5008 439/864 |
| 2021/0092872 A1* | 3/2021 | Iyengar | H05K 7/1401 |
| 2021/0198052 A1 | 7/2021 | Nagelmüller et al. | |
| 2023/0180421 A1 | 6/2023 | Williams et al. | |

OTHER PUBLICATIONS

International Search Report and Written Opinion for PCT Patent Application No. PCT/US22/47998, Mailed Feb. 27, 2023, 10 pages.

* cited by examiner

*Primary Examiner* — Imani N Hayman
*Assistant Examiner* — Hung Q Dang
(74) *Attorney, Agent, or Firm* — Compass IP Law PC

(57) ABSTRACT

An apparatus is described. The apparatus includes a rack shelf back interface. The rack shelf back interface has first and second flanges to mount to a rack's rear facing rack mounts. The rack shelf back interface has a power connector 610 on an inside of a back face of the rack shelf interface, the power connector to mate with a corresponding power connector on an electronic system that is to be installed in the rack shelf. The rack shelf back interface has an alignment feature on the inside of the back face of the rack shelf interface to ensure that the power connector properly mates with the corresponding power connector.

17 Claims, 22 Drawing Sheets

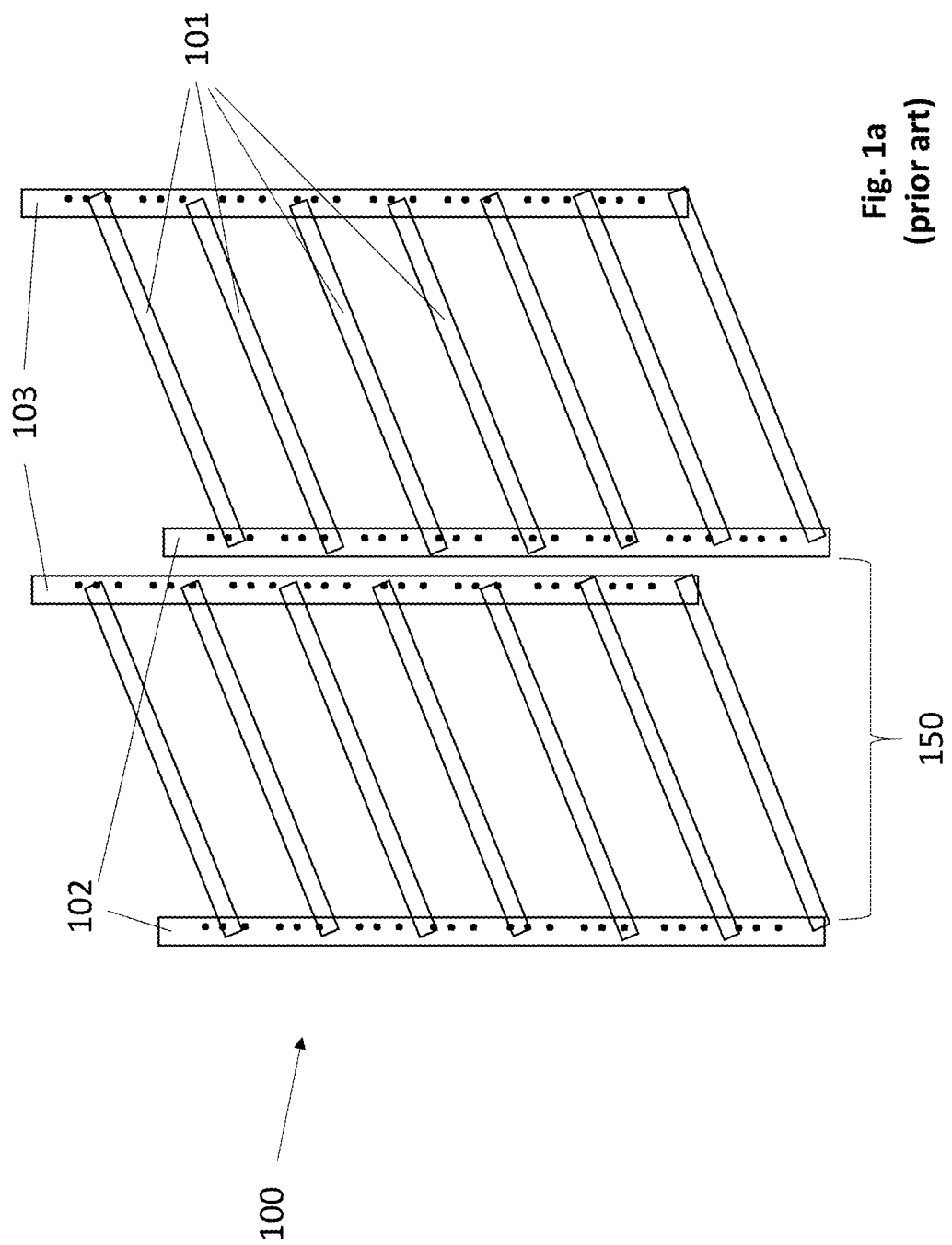

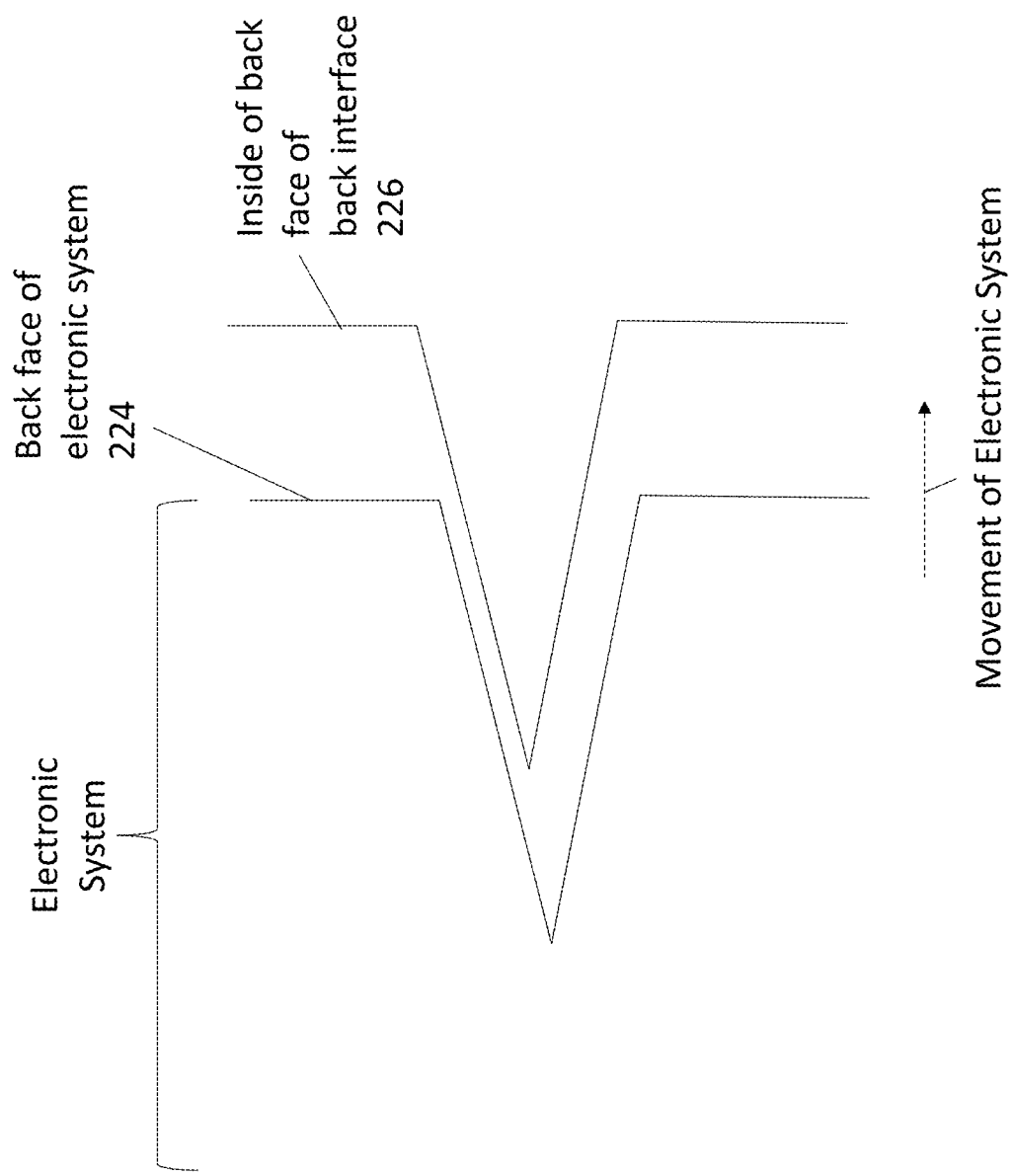

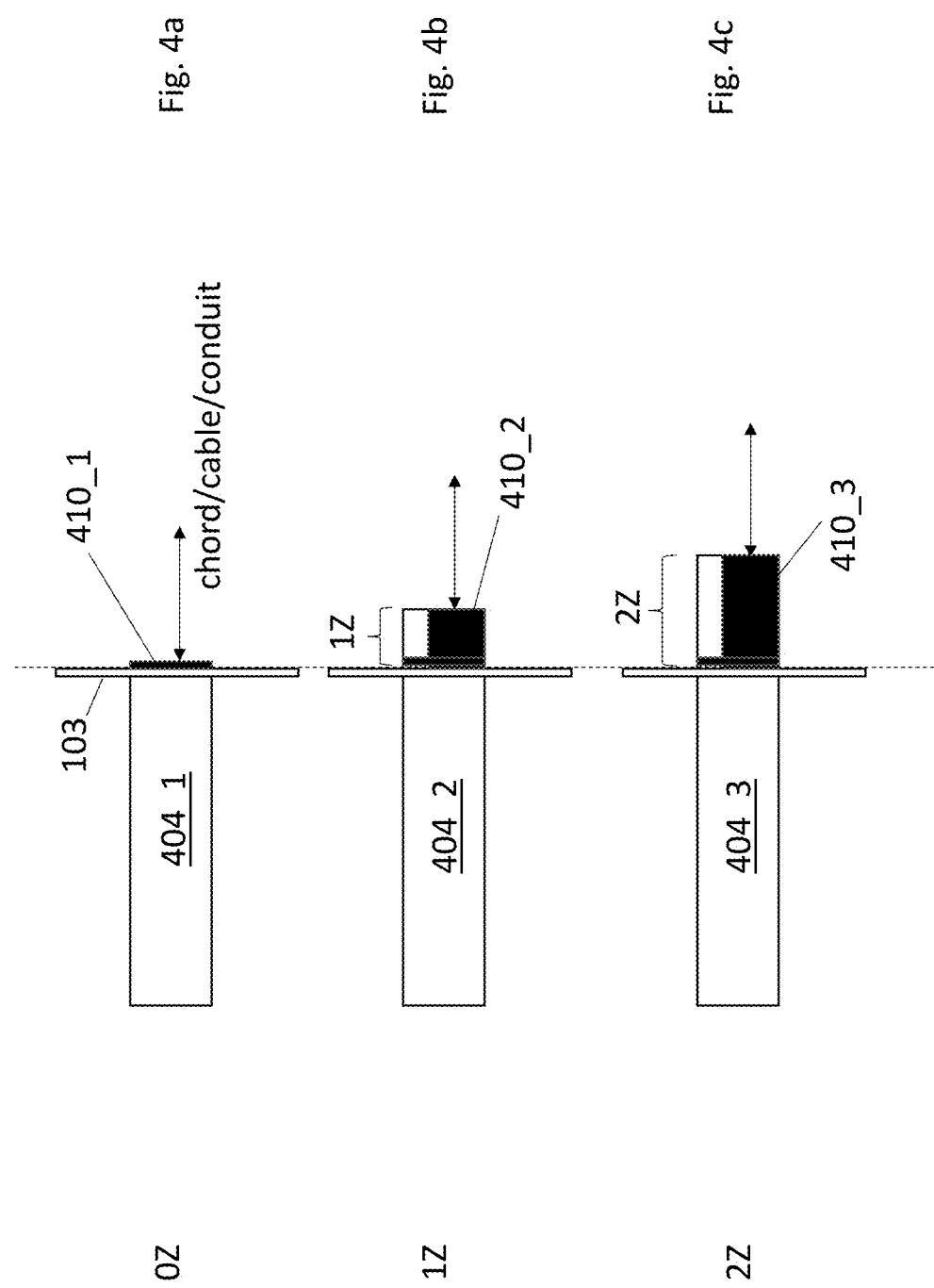

BACK INTERFACE FOR RACK SHELF

BACKGROUND

System design engineers face challenges, especially with respect to high performance data center computing, as both computers and networks continue to pack higher and higher levels of performance into smaller and smaller packages. Creative packaging solutions are therefore being designed to keep pace with such aggressively designed systems.

FIGURES

A better understanding of the present invention can be obtained from the following detailed description in conjunction with the following drawings, in which:

FIGS. 1a, 1b, 1c, 1d, 1e, and 1f depict various view of a rack (prior art);

FIGS. 2a, 2b, 2c, 2d, 2e, 2f, 2g, and 2h depict views of an embodiment of a rack shelf back interface;

FIGS. 3a, 3b, and 3c depict a back interface installed in a rack;

FIGS. 4a, 4b, and 4c depict different incremental electronic system depths and corresponding back interface;

DETAILED DESCRIPTION

Figure 1B:
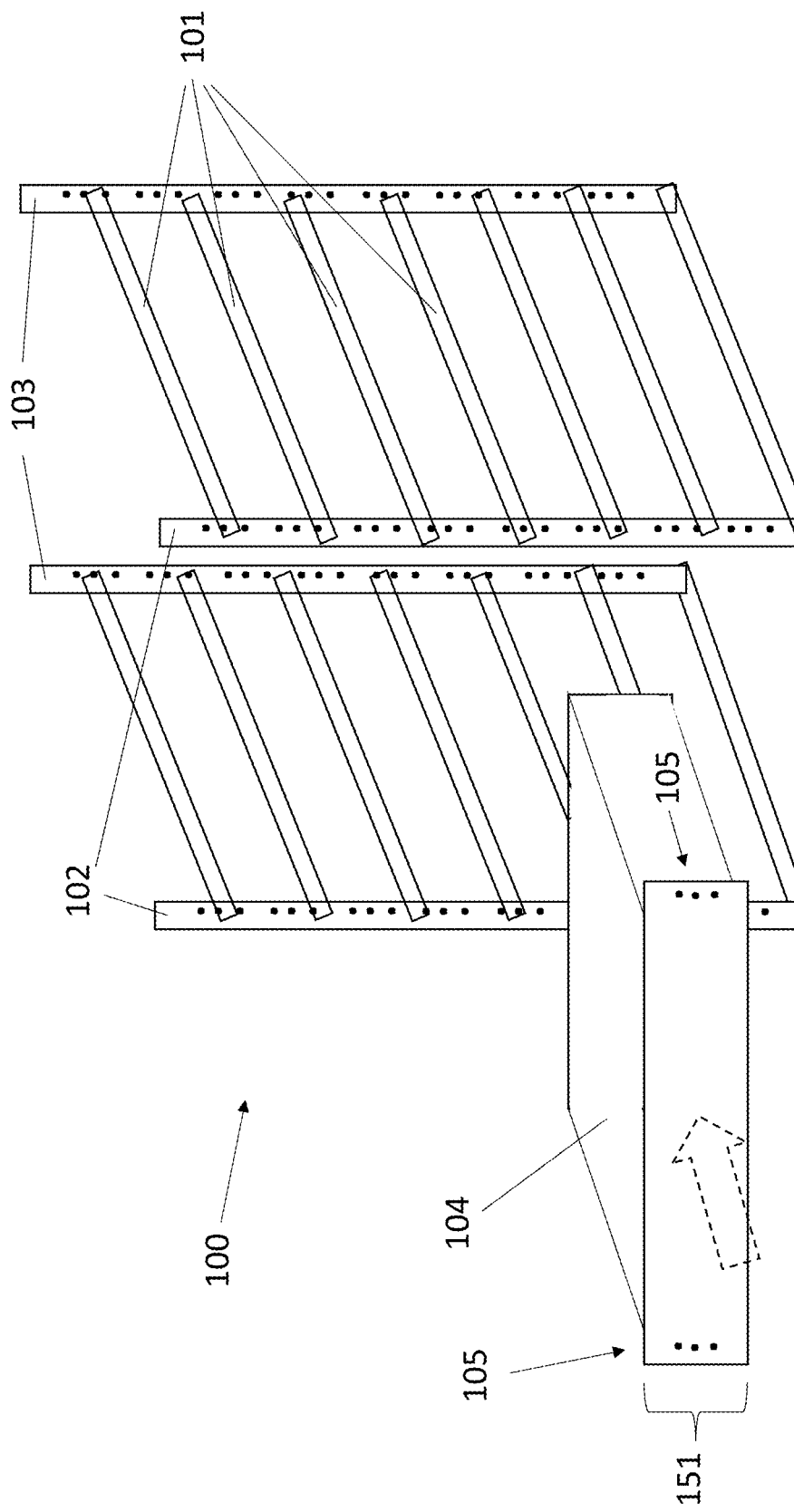

FIGS. 1a through 1f depict various views of rack mounted electronic systems. FIG. 1a depicts the skeletal structure of a rack 100 for housing electronic systems. As observed in FIG. 1a, the rack 100 includes an arrangement of slide rails 101, front facing mounts 102 and back facing mounts 103.

When installing an electronic system 104, referring to FIG. 1b, a technician slides the system 104 on the corresponding rails 101 of a particular one of the rack's "shelves" (rails can be implemented as, e.g., static "L" brackets, actual rollers, etc.). After the technician has slid the system 104 a sufficient distance along the rails 101, flanges 105 on the front face of the system will meet the front facing mounts.

Figure 1C:
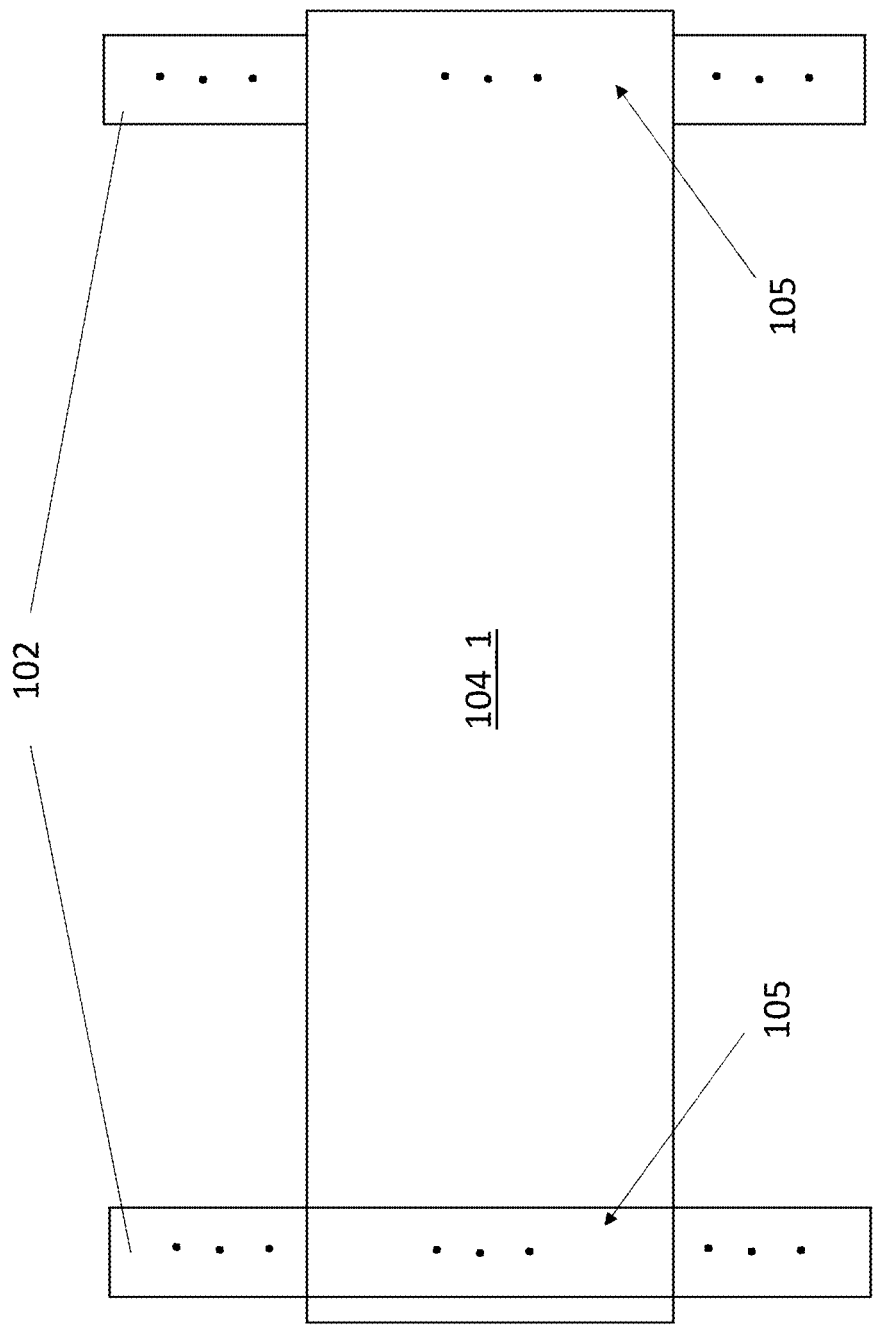

Referring to FIG. 1c, the flanges 105 and front facing mounts 102 have aligned holes through which thumb screws are threaded by the technician thereby mounting the front face of the electronic system 104_1 to the rack's front facing mounts 102. In the case of the rack specified by the Open-Compute Project, the system 104 slides along the rails 101 until some feature of the system 104 meets the back facing mounts 103. The system 104 is then mounted to the front facing mounts 102 (See, e.g., "Open Compute Project, Open Rack Standard V2.1" published by Open Compute.org).

The technician then walks behind the rack. For most electronic systems, the mounting of the system 104 to the front facing mounts 102 in combination with support provided by the rails 101, and/or other flooring, is sufficient to mechanically secure the system to the rack 100. Nevertheless, at least in some cases, referring to FIG. 1d, the technician mounts rear flanges 106 to the sides of the system 104 that corner with the back facing mounts 103.

Figure 1D:
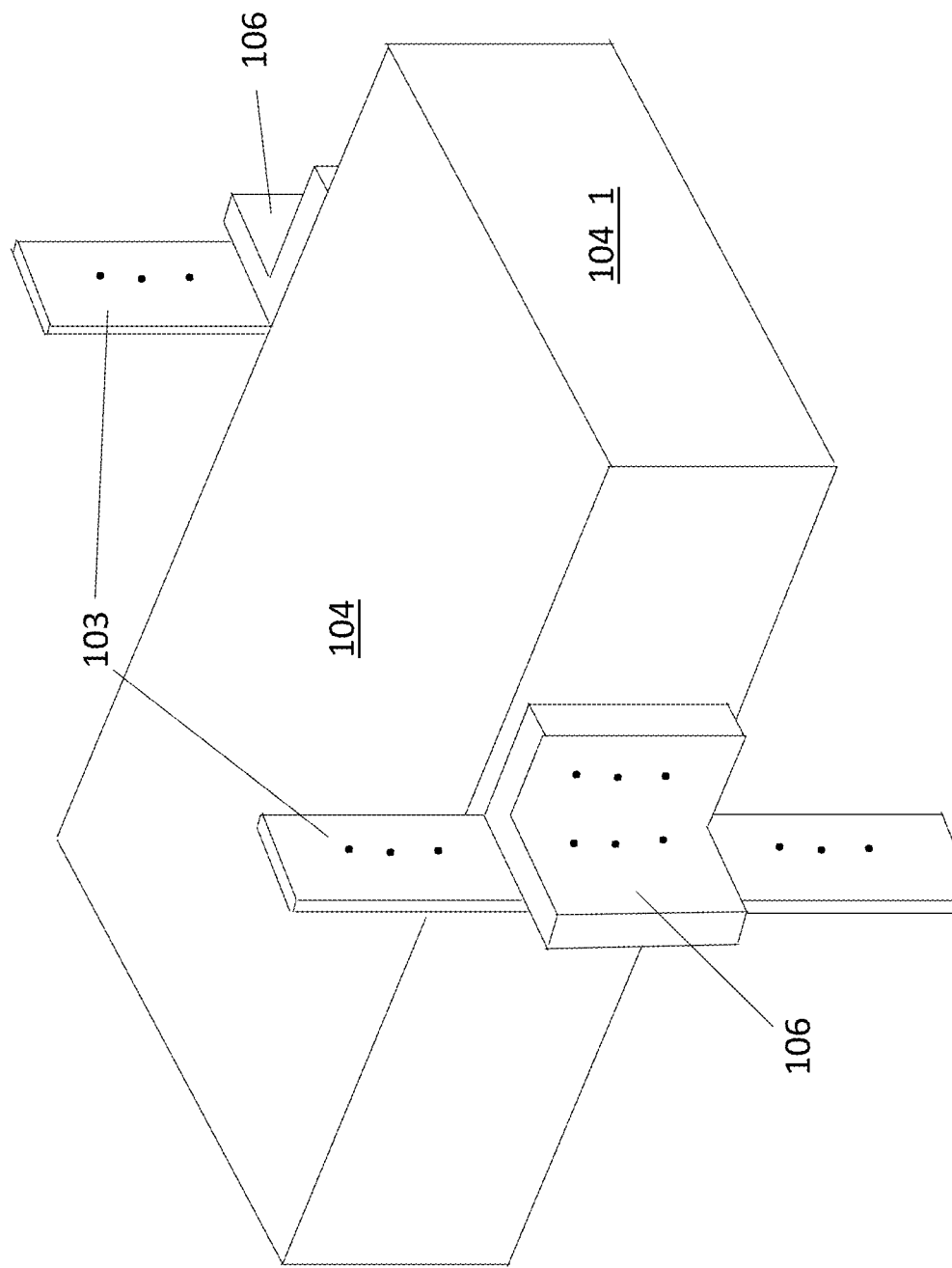

Each rear flange 106 is then mounted to its corresponding back facing mount 103 to secure the back of the system 104 to the rack. In many instances, the length of the system 104 is longer than the distance between the front and back facing mounts 102, 103 such that the back face 104_2 of the system 104 extends beyond the back facing mounts 103 as depicted in FIG. 1d.

Figure 1E:
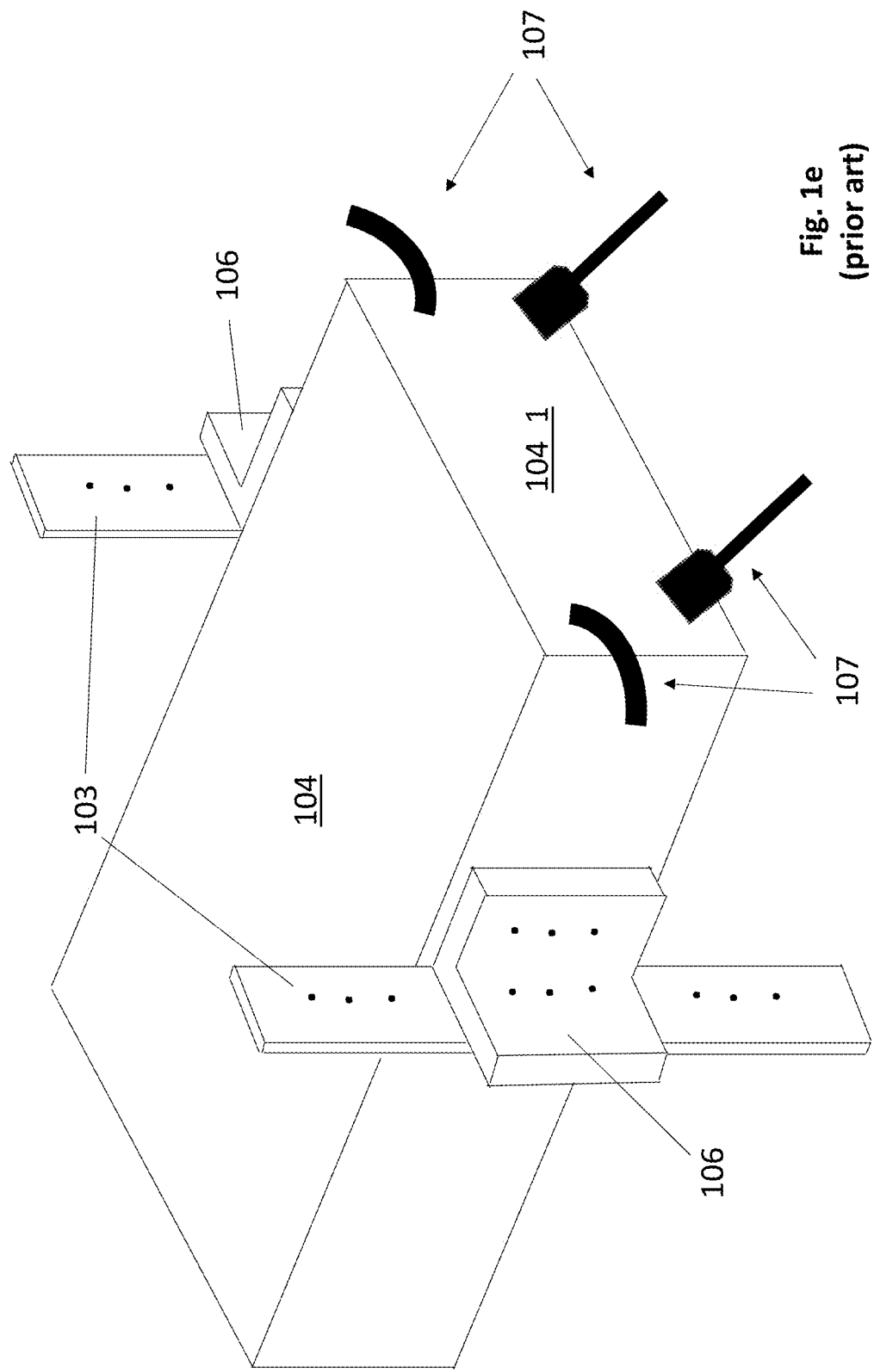

As depicted in FIG. 1e, the technician then plugs power chords, networking cables, and any liquid cooling fluidic conduits 107 to the back of the system 104_1. Here, the chords, cables, and conduits 107 emanate from the back of the shelf so that the technician can readily plug them into the back of the system 104_1 after the system has been guided along the shelf's rails and mounted to the front and back facing mounts 102, 103.

A problem is that the technician has to walk behind the rack in order mount the rear flanges 106 and plug the power chords, network cables, and fluidic conduits 107 to the back of the system 104_1. Here, the electronic systems 104 that are mounted into a rack are typically designed to blow their hot exhaust air through the back of the system 104_1. Thus, in cases where a number of systems are already plugged into and operating from within the rack, including additional systems that are operating within neighboring racks, the region behind the rack where the technician is standing can be uncomfortable because of its high temperature.

Figure 1F:
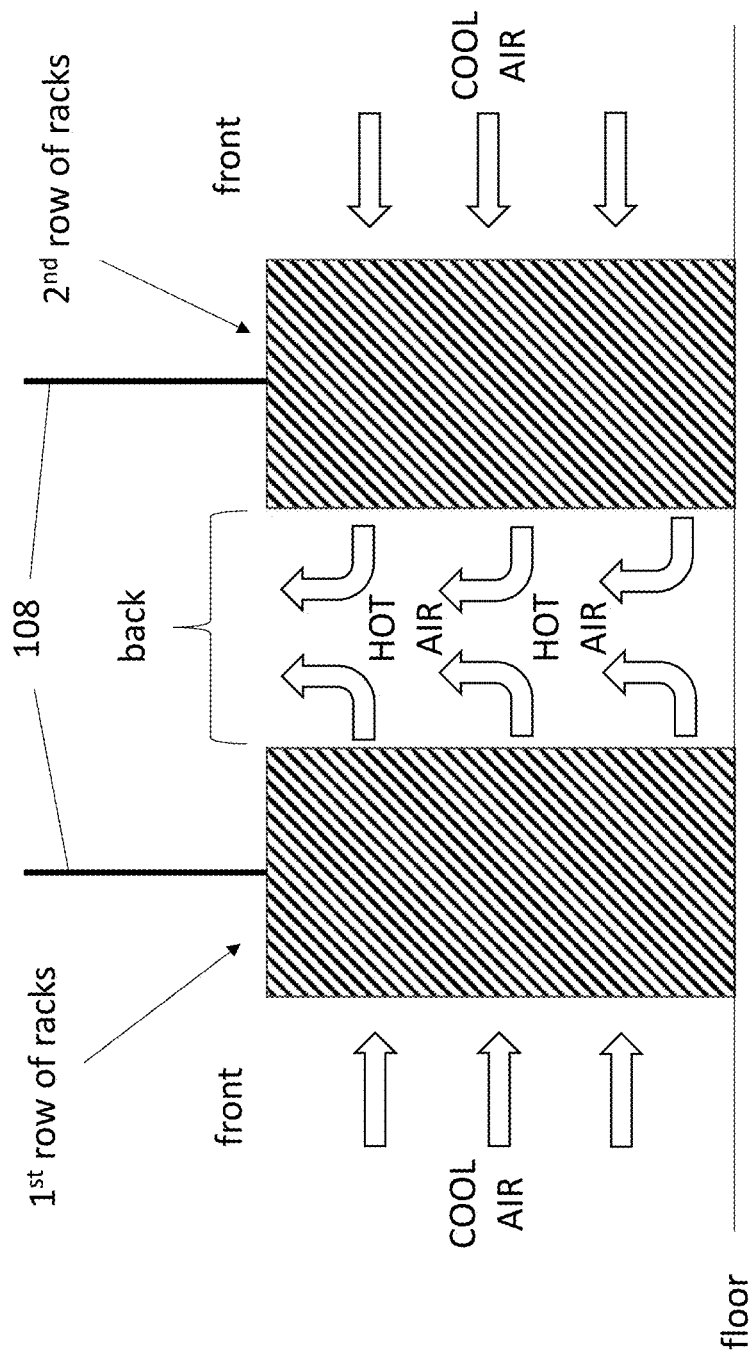

Generally, referring to FIG. 1f, multiple racks having respective equipment mounted therein are aligned in rows with their respective backs facing each other and their respective fronts pointed away from each another. Often, walls 108 separate the front of the racks from the back of the racks so cool air can flow into the systems through the front of the racks and hot exhaust air can be collected from the back of the racks and vented.

Additionally, a large amount space is reserved behind the racks in order to accommodate the technician's performing of the aforementioned installation tasks (mounting of rear flanges and plugging in of the power, networking, and fluidic conduits). This space corresponds to increased floor space for the overall data center implementation, which, in turn, drives up data center implementation costs.

FIGS. 2a through 2g depict an improved approach in which the back of the rack shelves are fitted with a common back interface 210, e.g., as part of a rack's initial configuration prior to installation of electronic systems within the rack. As will be described in more detail further below, as part of installing a back interface 210 for a particular shelf, the power chords, network cables, and fluidic conduits that have been routed in the rack for that shelf are plugged into that shelf's back interface.

Upon the back interfaces being installed with their respective chord/cables/conduit connections along their respective shelfs, the rack is then positioned, e.g., along a row of racks. Importantly, with the back interfaces being installed in the rack, a technician need not walk behind the rack to install an electronic system into any particular shelf. Rather, the technician simply walks to the front of the rack, slides an electronic system along the rails of a particular one of the rack's shelves and mounts the electronic system to the front facing mounts.

Here, as the electronic system is near the end of being slid along the shelf's rails, the back of the electronic system mechanically engages with the back interface 210 which, in turn, mechanically couples the shelf's power chords, network cables, and fluidic conduits to the back of the electronic system. Additionally, the back interface 210 can also provide some form of flooring that the underside of the back of the system rests upon for additional mechanical support.

In short, a shelf's back interface 210 automatically couples the power chord, network cable, and cooling fluid conduit connections to the back of an electronic system while that system is being installed in the shelf.

Figure 2A:
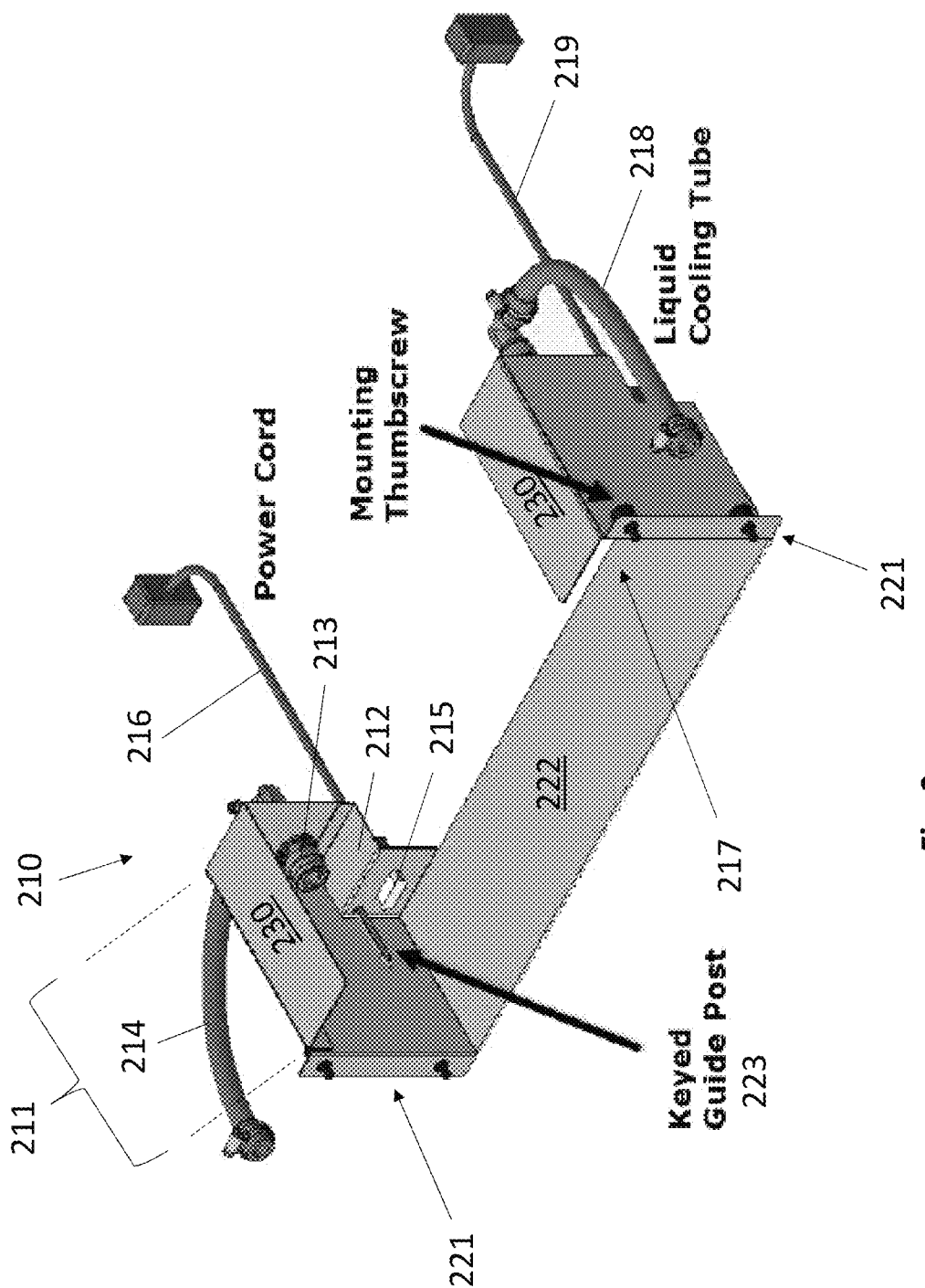

FIG. 2a shows a first angled view of a back interface 210 according to one embodiment. As observed in FIG. 2a, the back interface 210 has the general shape of a cavity of some depth 211. As the electronic system is being slid along the shelf rails, the back of the system enters the cavity 211 until the system's power/network/fluidic connections are flush against the corresponding connections 213, 215 on the inside of the cavity.

The particular back interface 210 embodiment of FIG. 2a includes a left back face 212 having a first fluidic connection 213 that is coupled to a "hot" out-take fluidic conduit 214. The hot out-take fluidic conduit 214 receives warmed fluid from the electronic system and directs it further within the rack's hot egress fluidic conduits for subsequent cooling by, e.g., data center liquid cooling equipment. Additionally, the left back face 212 includes a first power connection 215 that is coupled to a first power chord 216.

Similar connections exist inside a right back face 217 but are not visible in FIG. 2a owing to the angle of FIG. 2a's perspective. The fluidic conduit associated with the right back face's fluidic connection is a "cold" intake fluidic conduit 218 that supplies cooled fluid to the electronic system. A second power connection that is coupled to a second power chord 219 is also present on the inside of the right back face 217.

For ease of drawing, the back interface 210 of FIG. 2a does not include a network cable interface on either of the back faces 212, 217 but one or more such interfaces could readily be added/included.

The back interface 210 of FIG. 2a also includes flanges 221 that are used to mount the back interface 210 to the rear facing rack mounts 103 during installation of the back interface 210 to the rack (prior to installation of the electronic system).

The particular back interface 210 embodiment of FIG. 2a also include a floor 222 that mechanically integrates the left and right sides and back faces into a single, cohesive unit. Moreover, the floor 222 provides mechanical support for the rear of the electronic system. Here, the flanges 221 of the back interface 210 consume the rack's rear facing mounts 103 at the expense of flanges 106 as depicted in FIG. 1d. That is, the back interface 210 mounts to the rear facing mounts 103 rather than the electronic system. Nevertheless, the back of the electronic system can receive mechanical support by resting on floor 222.

The particular embodiment of FIG. 2a also includes a guide post ("pin") 223 that emanates toward the electronic system from the inside of the left back face 212. Another such pin can also exist on the inside of the right back face 217 but is not visible in FIG. 2a.

Figure 2B:
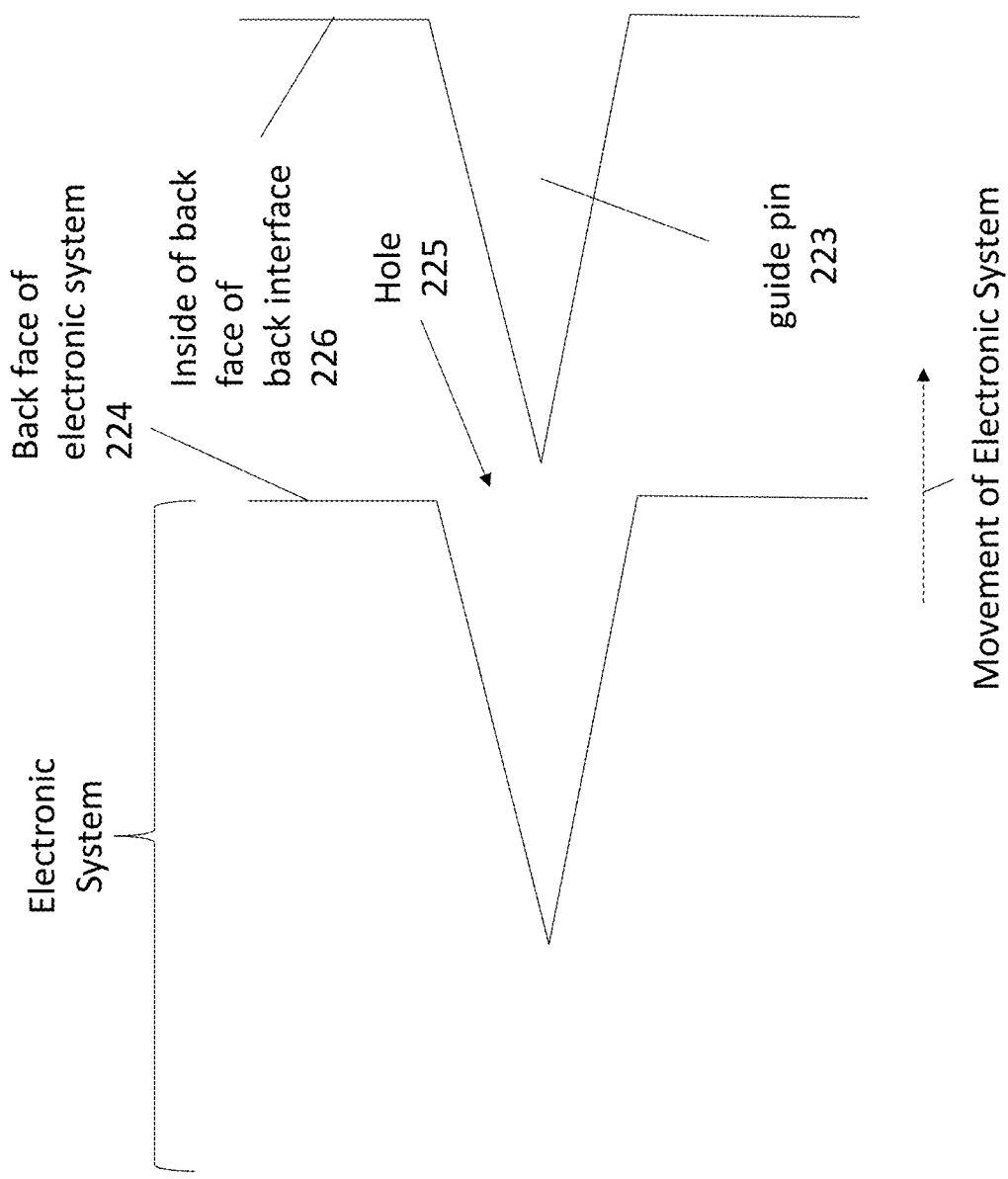

Referring to FIG. 2b, which depicts a side view, the back of the electronic system 224 has a corresponding hole 225 to receive guide pin 223. During installation of the electronic system, when the electronic system is sliding on the shelf's rails toward the inside face(s) of the back interface 226, the guide pin 223 will enter the corresponding hole 225 at the back of the electronic system 224.

Figure 2D:
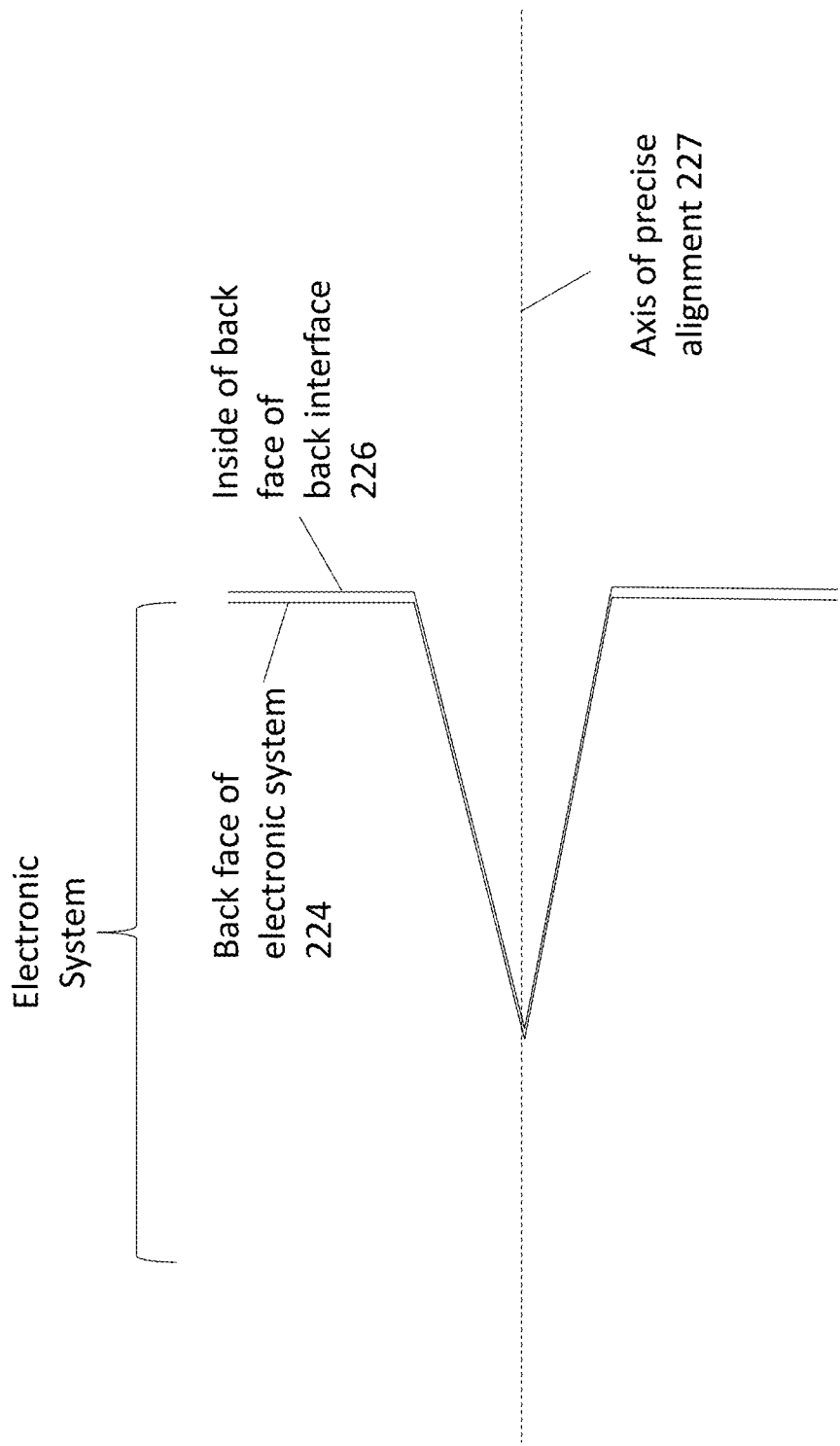

The opening of the hole 225 at the back face of the electronic system 224 is large and the tip of the guide pin 223 is narrow so that there is plenty of tolerance to ensure the pin 223 will enter the hole 225 when the back face of the system 224 reaches the tip of the pin 223. As the system continues to be pushed towards the back face 226 of the interface, however, as depicted in FIG. 2c, the width of the hole 225 narrows and the width of the pin expands to bring the system's connectors into precise alignment with their corresponding connections at the back interface once the pin 223 is fully inserted in the hole 225 as depicted in FIG. 2d.

The precise alignment results in an axis 227 of precise alignment from which the locations of the connectors on both the electronic system and the inside face of the back interface can be defined in reference to.

Figure 2E:
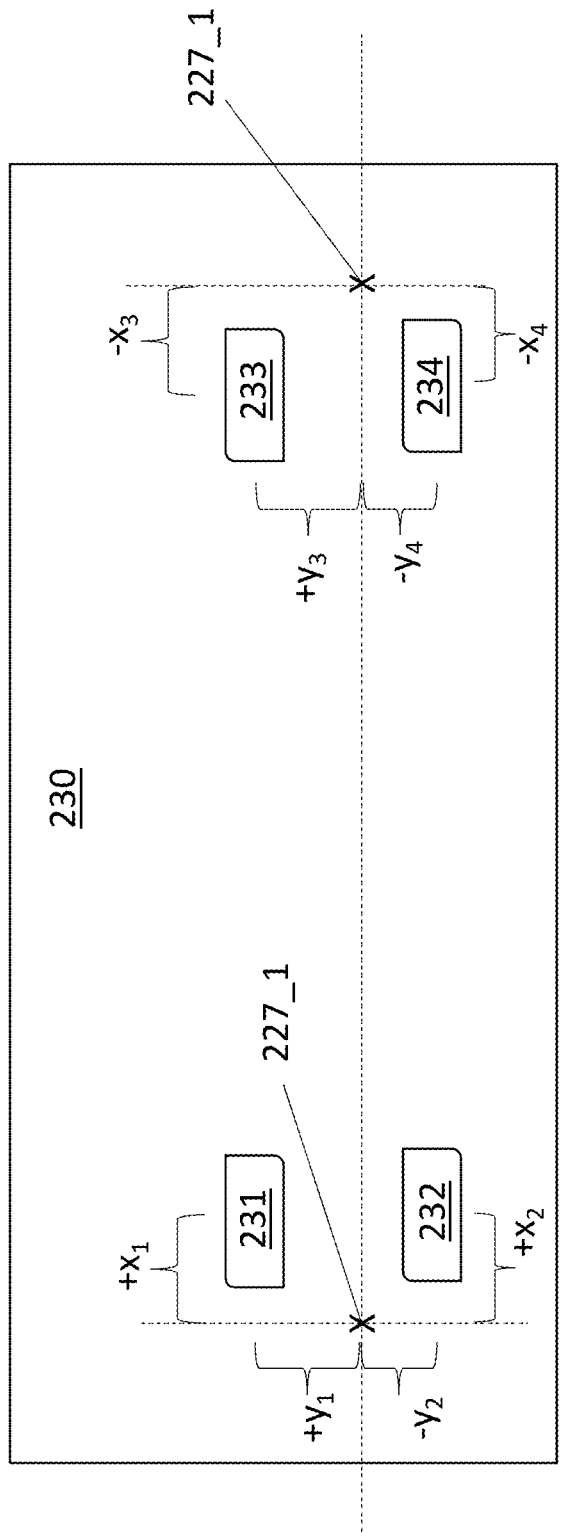

Specifically, FIG. 2e shows a direct view of the back face of the electronic system or the back interface. In the embodiment of FIG. 2d there are two hole and pin arrangements resulting in a pair of axes of precision 227_1, 227_2. The leftwise axis of precision 227_1 is used to define the respective locations of leftwise connectors 231, 232. Specifically, the position of connector 231 is defined as +x1, +y1 and the position of connector 232 is +x2, −y2. Similarly, from rightwise axis 227_2, the position of connector 233 is defined as −x3, +y3 and the position of connector 234 is −x4, −y4.

Importantly, the location of each of the connectors 231, 232, 233, 234 defines the location of a pair of corresponding connectors: a first on the back face of the electronic system and a second on the inside of the back face of the back interface. By designing both the electronic system and the back interface to have identical coordinate locations relative to a same axis of precision for each pair of corresponding connectors, the connectors will successfully mate as each system connector presses into the corresponding interface connector during installation of the system.

Figure 2F:
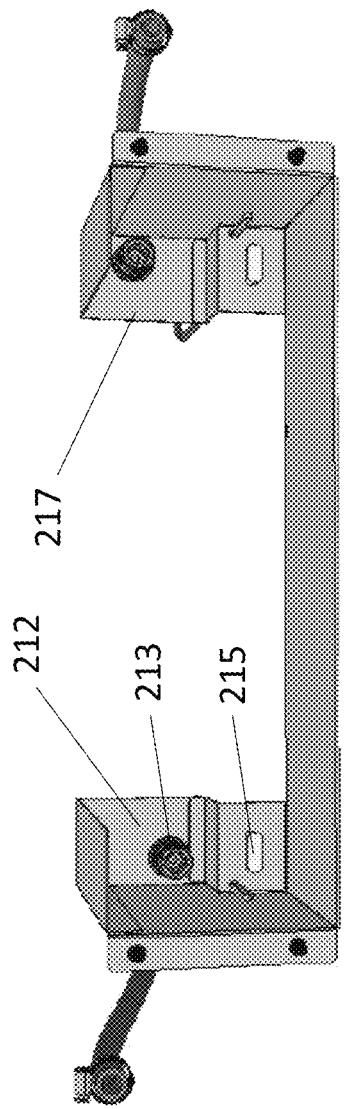
Figure 2G:
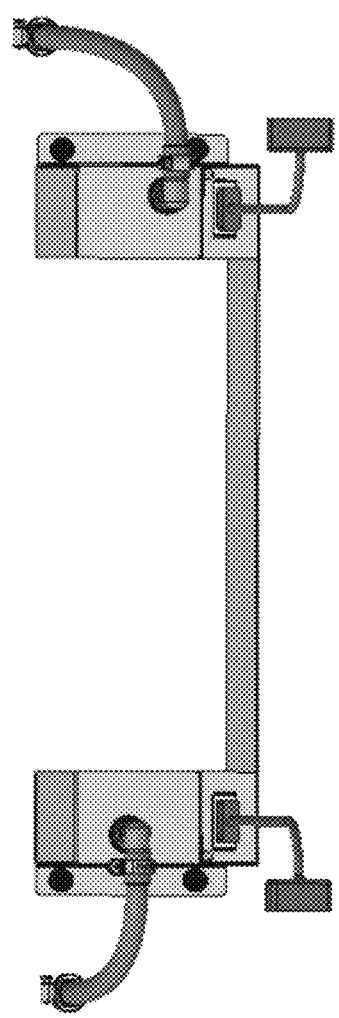
Figure 2H:
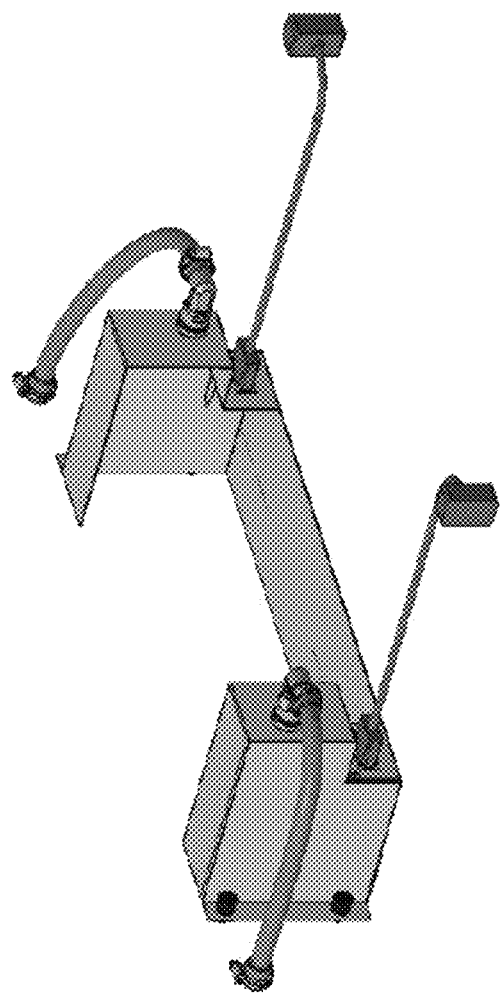

FIG. 2f shows a view of the back interface 210 of FIG. 2a looking directly into the cavity 211. Here, the aforementioned the left side fluidic 212 and power 213 connectors on the left inner back face 212 are visible as are corresponding connectors on the right back face 217. FIG. 2g shows a direct rear view, while FIG. 2h shows an angled rear view, of the back interface 210 of FIGS. 2a and 2e.

Figure 3A:
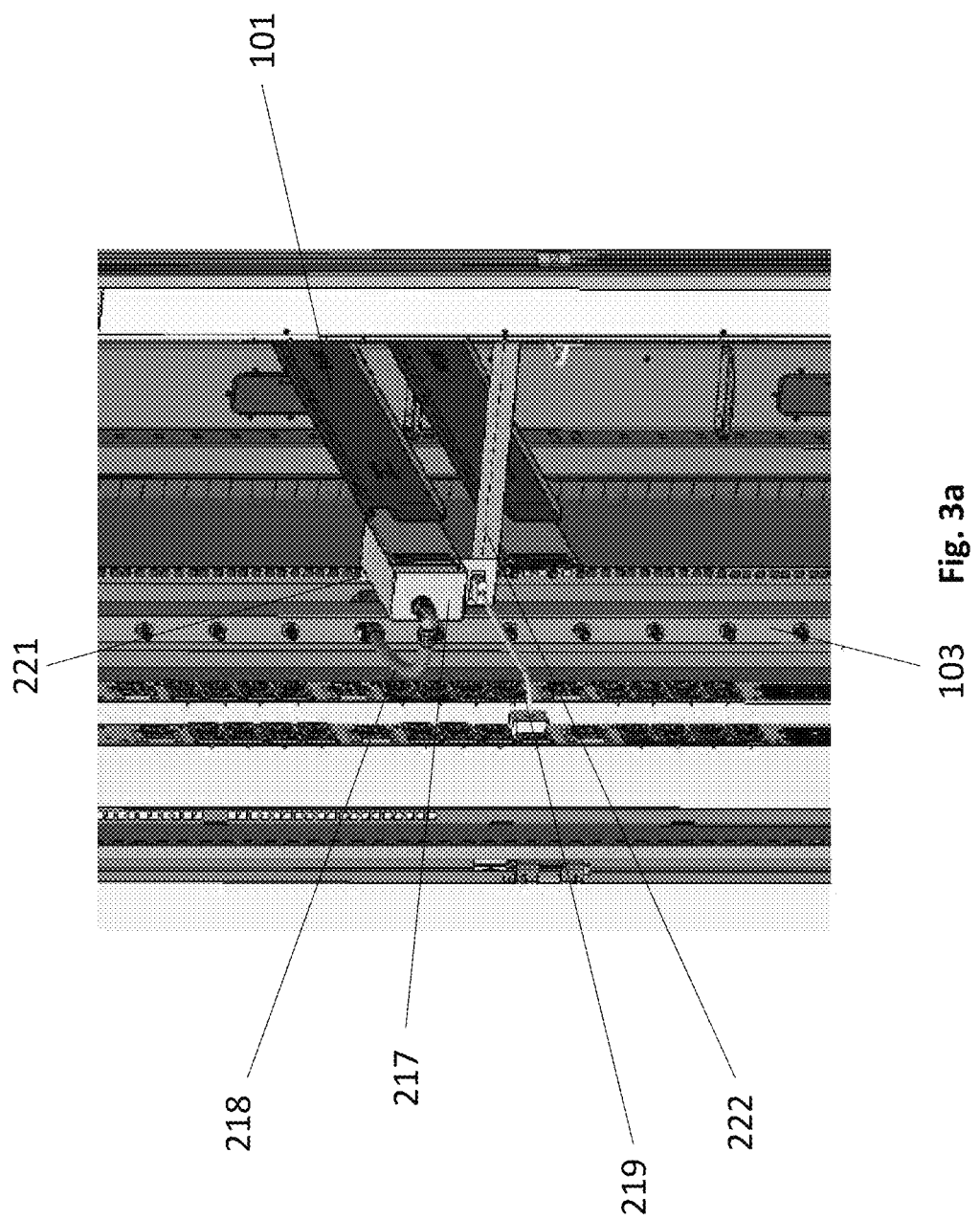
Figure 3B:
Figure 3C:
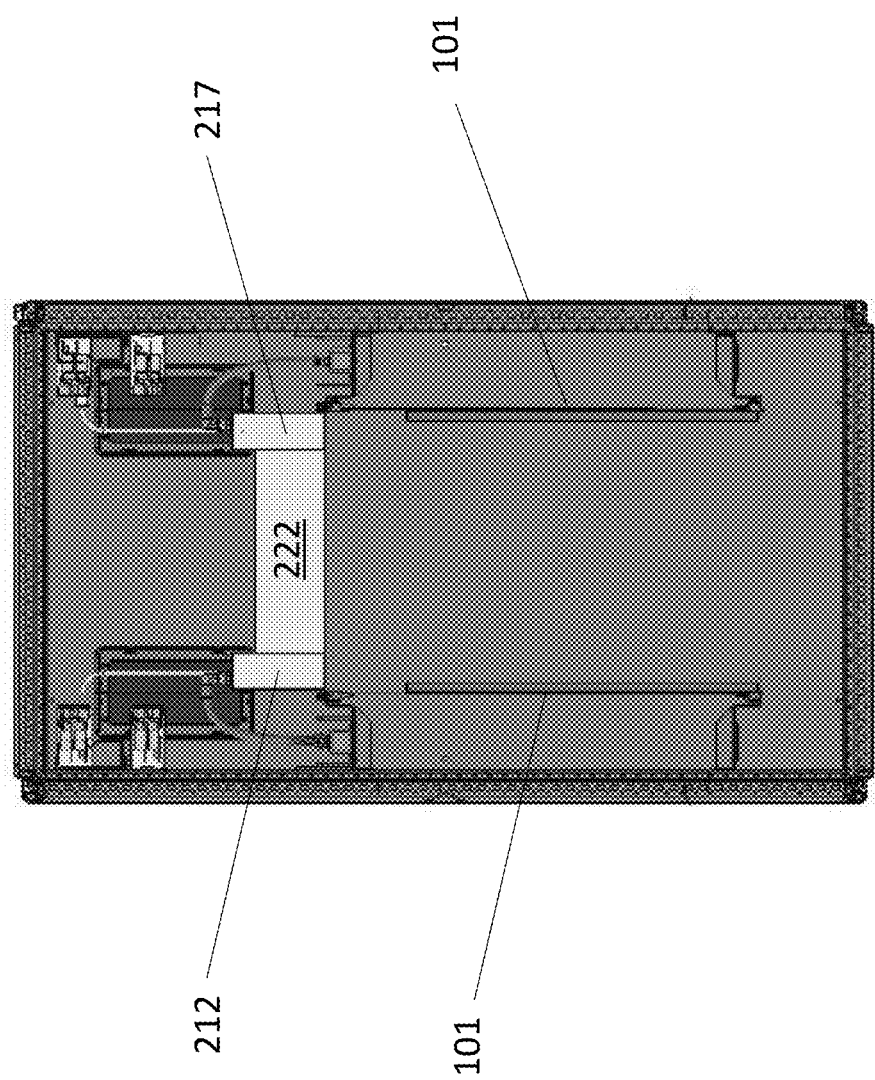

FIGS. 3a through 3c show views of the back interface embodiment 210 of FIG. 2a mounted to a rack. FIG. 3a shows an angled view looking into the back of a rack. Here, the right back face 217 of the back interface is visible while the left back face 212 is hidden behind the frame of the rack's rear door. Notably, the right back face 217 is on the same side of the back interface 210 as the right back face 217 of FIG. 2a. However, because FIG. 2a shows a front side view the interface 210, while, FIG. 3a shows a rear view of the interface, the right back face 217 appears on the left in FIG. 3a.

FIG. 3a depicts (a top corner of) the right side flange 221 mounted to one of the rear facing mounts 103 of the rack as well as the floor 222 of the back interface 210. Notably, one of the rails 101 associated with the particular rack shelf that the back side interface 210 is mounted to and the rail's relationship with the right back face 217 are also depicted.

FIG. 3a also shows the cold intake conduit 218 emanating from the rear of the right back face 217 and connecting into the rack's conduit lines. Likewise, FIG. 3a shows the right side power chord 218 emanating from the rear of the right back face 217 and connecting into the rack's power bus.

FIG. 3b shows the same view as FIG. 3a but with the electronic system having been installed into the rack and the back side interface.

FIG. 3c shows a top down view of the inside of the rack. Here, the back side interface is shown with both power chords and both fluidic conduits emanating from the interface and connecting to the rack. As depicted, both of the interface's flanges are mounted to the rack's rear facing mounts. The rails 101 of the particular shelf that the interface is associated with are also depicted.

FIGS. 4a through 4c explore different standard industry specification possibilities for different sized electronic systems and their corresponding standard back interfaces.

However, referring briefly back to FIG. 1a, a typical rack 100 has front facing mounts 102 that are spaced a set distance apart 150. Generally, the width of any/all electronic systems that are to be mounted to the rack 100 cannot exceed the spacing 150 between front facing mounts 102 (but narrower, e.g., "half width" components that mount to only one front facing mount can exist).

One example are systems and racks that conform to the International Electrotechnical Commission (IEC) Specification 60297 (entitled, "Mechanical structures for electronic equipment-Dimensions of mechanical structures of the 482.6 mm (19 in) series"). This particular standard sets a distance 150 of 19 inches between front facing mounts 102. Other distances are possible (such as 23 inches).

The various electronic systems that can be installed into the rack 100 can have varying heights. According to current industry practice, referring now to FIG. 1b, a system height 151 of 1 U vertically along the front facing mounts 102 corresponds to 1.75". The respective height 151 of various systems that can mount to the front facing mounts 102 are usually specified in units of U (e.g., 1 U, 2 U, 3 U, etc.).

Thus, once an electronic system is designed to fit into a particular rack, the width of the system should stay within the distance 150 between the front facing mounts (e.g., 19" or 23") and the height 151 of the system can be specified in units of U.

Importantly, the depth of the electronic system can vary and different standardized back interfaces can be defined that establish different system depths and corresponding back interface cavities in increments.

FIGS. 4a through 4c show side views of different systems 404_1, 404_2, 404_3 having different depths that result in different extensions of the systems 404_1, 404_2, 404_3 beyond a rack's rear facing mount 103. The depth of a system is how far the system extends into the rack upon being mounted to the front side mounts 102.

For example, a unit distance along the depth axis of can be established (e.g., Z=2"). A system having a depth of 0 Z, as depicted in FIG. 4a, corresponds to a system whose back face aligns with the rear facing mount 103. The appropriate standardized back interface 410_1 for a 0 Z system likewise positions the connectors to align with the rear facing mounts 103. In the 0 Z case, it is possible to implement the standard back interface 410_1 as left and right plates that mount to the read facing mounts 103 with little or no floor.

By contrast, referring to FIG. 4b, a system 404_2 having a depth of 1 Z corresponds to a system 404_2 whose back face resides 2 Z behind the rear facing mounts 103. The appropriate standardized back interface 410_2 for a 1 Z system therefore positions the connectors to be 1 Z behind the rear facing mounts 103. Likewise, referring to FIG. 4c, a system 404_3 having a depth of 2 Z corresponds to a system 404_3 whose back face resides 2 Z behind the rear facing mounts 103. The appropriate standardized back interface 410_3 for a 2 Z system 404_3 therefore positions the connectors to be 2 Z behind the rear facing mounts 103.

As discussed above with respect to FIG. 2e, the positions of the connectors can also be standardized, e.g., relative to the position of the interface guide pin and the corresponding system hole and resulting axis of precision.

A set of mechanical specifications can therefore be developed for both electronic systems and corresponding standard back interfaces that define: 1) the manner and location of one or more holes and guide pins that define one or more axes of precision; 2) system/interface connector pairs defined by connector type (e.g., specific chord, cable or conduit) and location relative to an axis of precision; and, 3) system depth and corresponding back interface cavity depth defined in specified increments of Z (where Z can be any predefined distance, e.g., 1.5", 2.0", 2.5", etc.). Multiple, different mechanical specifications/standards can therefore be defined where each unique specification/standard defines a unique set of the three above parameters.

Note that the back interface can be manufactured to include any of the power chords, network cables or fluidic conduits as integrated components of the interface (e.g., chords/cables/conduits "hang" off the back of the back interface). Alternatively, any of the power chords/cable/conduits can be assumed to be provided by the rack and the back interface has connectors at the outer back face to receive any such chords/cables/conduits.

Note that the guide pin and hole system described above with respect to FIGS. 2b, 2c, and 2d are more generally mechanical alignment features. Other mechanical alignment features are possible. For example, a guide pin can be mounted at the back of the electronic system and the hole to receive the pin can be integrated on the inside of the back face of the back interface. In another embodiment the back interface has a floor that supports the system from the bottom, a ceiling to prevent the system from substantially moving upward/downward, and sides to substantially prevent side-to-side motion. With sufficient mechanical precision/tolerance of these features, enough guidance can be provided to the system during installation for successful mating between corresponding connectors of the system and the back interface.

Note that the connectors on the back of the electronic system and the corresponding connectors on the inside of the back face of the back interface can be referred to as "power connectors", "network connectors" and "fluid connectors" and the like because these connectors mate without a chord/cable/conduit existing between the system/interface connection.

In various embodiments, referring back to FIG. 2a, the back interface additionally includes a support ceiling 230 that sits above the inserted shelf to prevent upward/downward movement of the shelf during a shock or vibration event.

Figure 5:
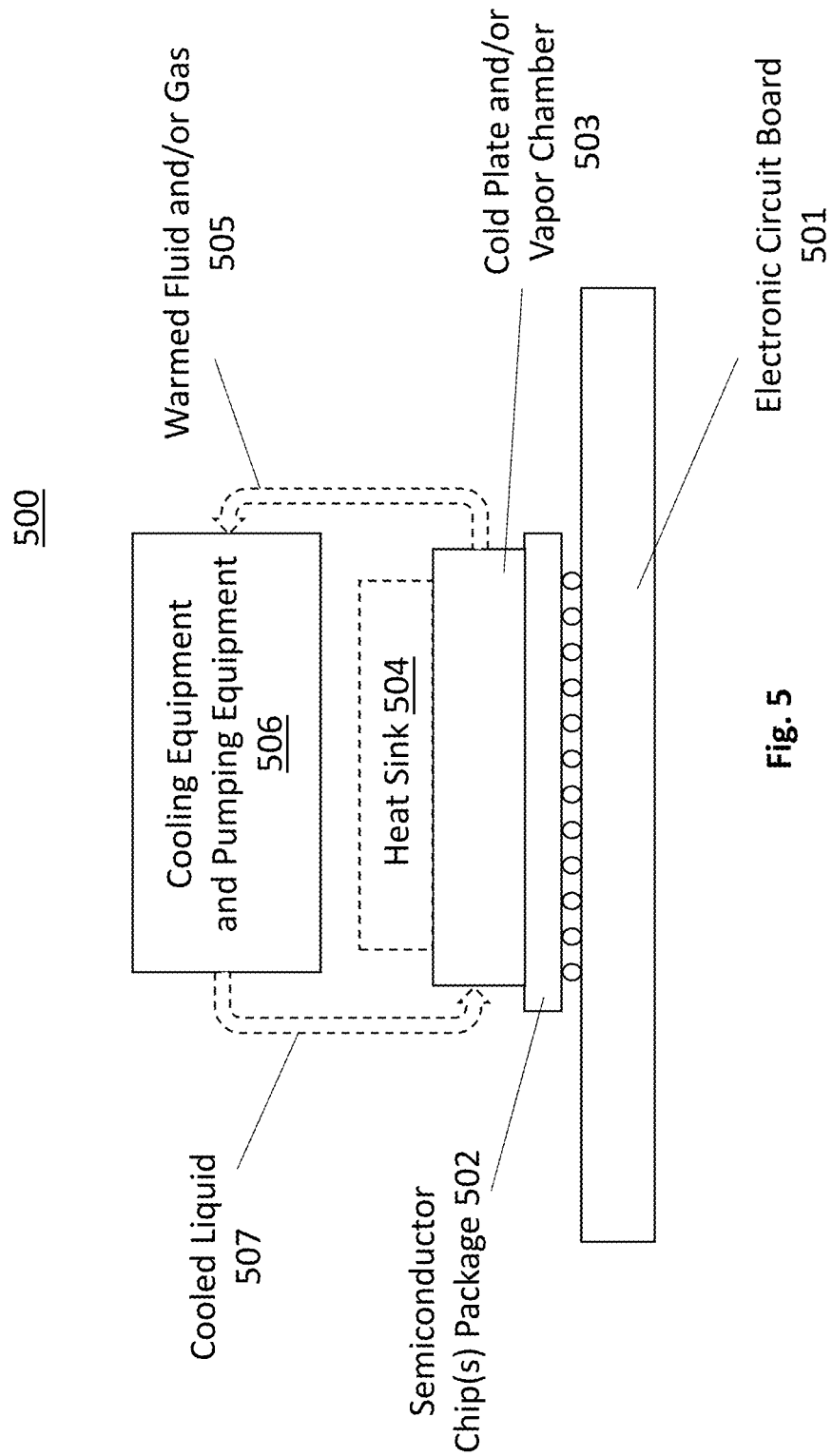
FIG. 5 depicts a liquid cooling system.

The teachings above can be applied to the cooling apparatus 500 of FIG. 5. FIG. 5 depicts a general cooling apparatus 500 whose features can be found in many different kinds of semiconductor chip cooling systems. As observed in FIG. 5, one or more semiconductor chips within a package 502 (such as memory chips) are mounted to an electronic circuit board 501 (such as a DIMM). A cold plate 503 is thermally coupled with the package 502 (e.g., by being placed on the package 502 with a thermally conductive material ("thermal interface material") between them) so that the cold plate 503 receives heat generated by the one or more semiconductor chips (the cold plate 503 can also be referred to as a vapor chamber in the case of two phase cooling systems).

Liquid coolant is within the cold plate 503. If the system also employs air cooling (optional), a heat sink 504 can be thermally coupled to the cold plate 503. Warmed liquid coolant and/or vapor 505 leaves the cold plate 503 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 506. Cooled liquid 507 then enters the cold plate 503 and the process repeats.

Here, one or more semiconductor chips within a system that plugs into a rack shelf as described above with respect to FIGS. 2*a-h*, 3*a-c*, and 4*a-c* can be cooled with liquid cooling as described immediately above with respect to FIG. 5. Here, cooled liquid can enter the system and be distributed to the respective cold plates in the system. The warmed fluid is then collected within the system so that it can collectively flow out of the system's hot out-take fluidic conduit.

With respect to the cooling equipment and pumping equipment 506, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 506 can be supplied by the cold plate of one semiconductor chip package or the respective cold plate(s) of multiple semiconductor chip packages.

In the case of the later (intake received from cold plate(s) of multiple semiconductor chip packages), the semiconductor chip packages can be components on a same electronic circuit board or multiple electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers). In essence, the general depiction of FIG. 5 describes compact cooling systems (e.g., a cooling system contained within a single electronic system), expansive cooling systems (e.g., cooling systems that cool the components of any of a rack, multiple racks, a data center, etc.) and cooling systems in between.

Although FIG. 5 shows the cold plate 503 in direct contact with a semiconductor chip package, in other embodiments one or more intervening structure(s) can exist along the thermal path between the cold plate and the semiconductor chip package.

Figure 6:
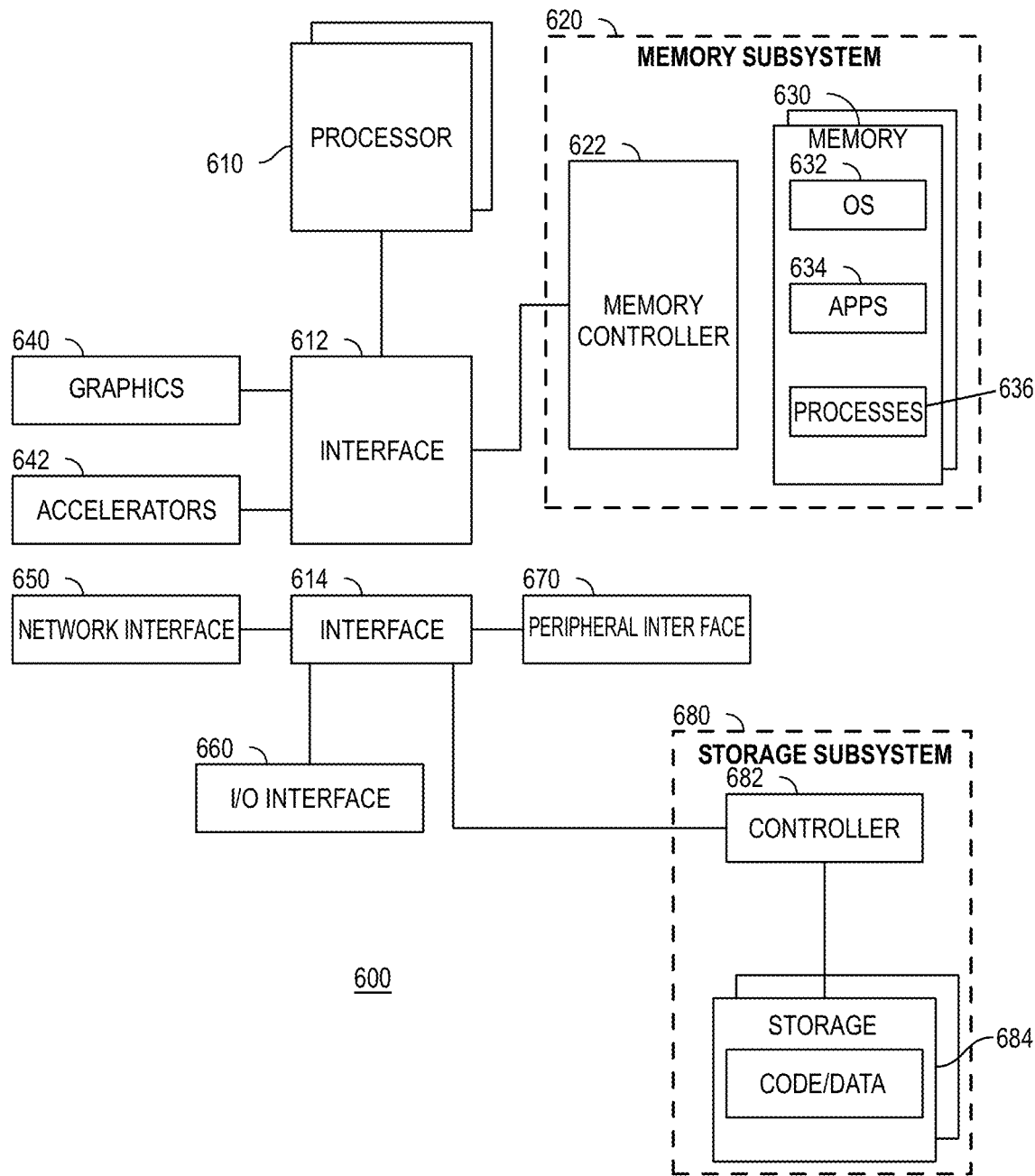
FIG. 6 depicts an electronic system.
Figure 7:
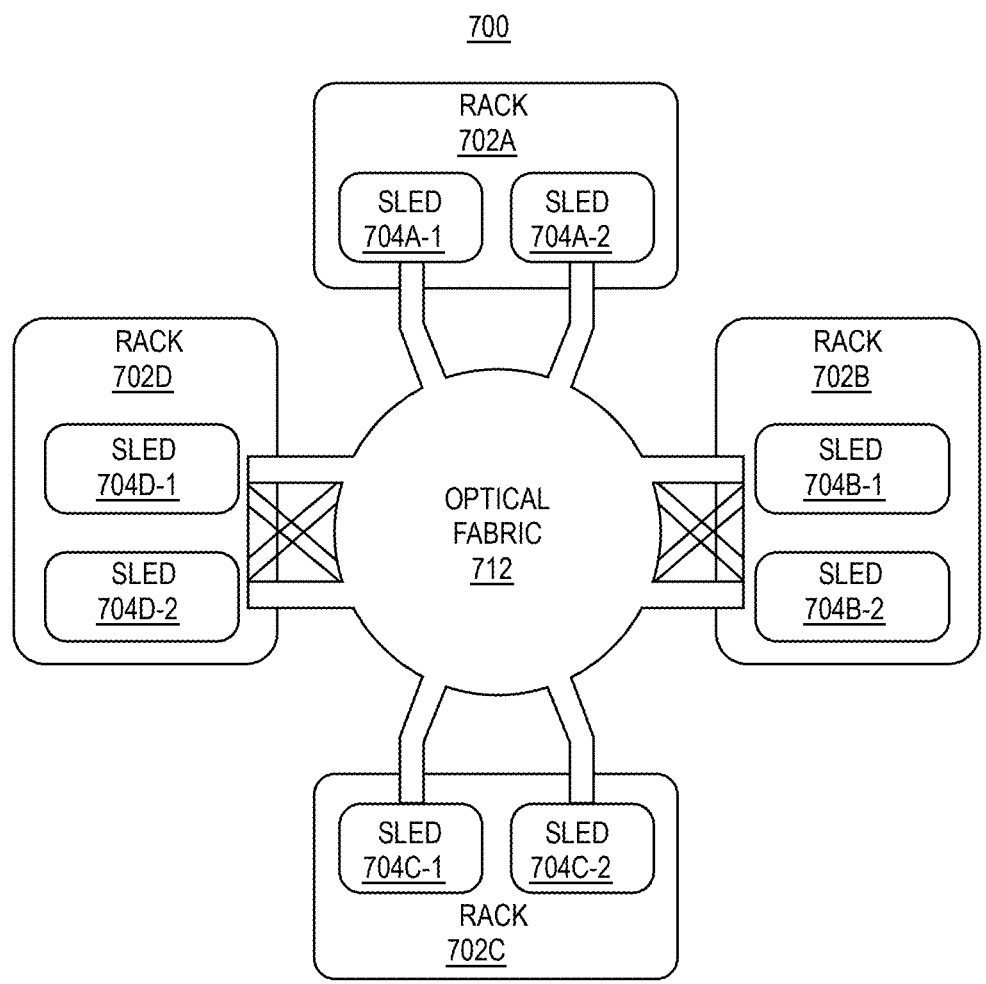
FIG. 7 depicts a data center.
Figure 8:
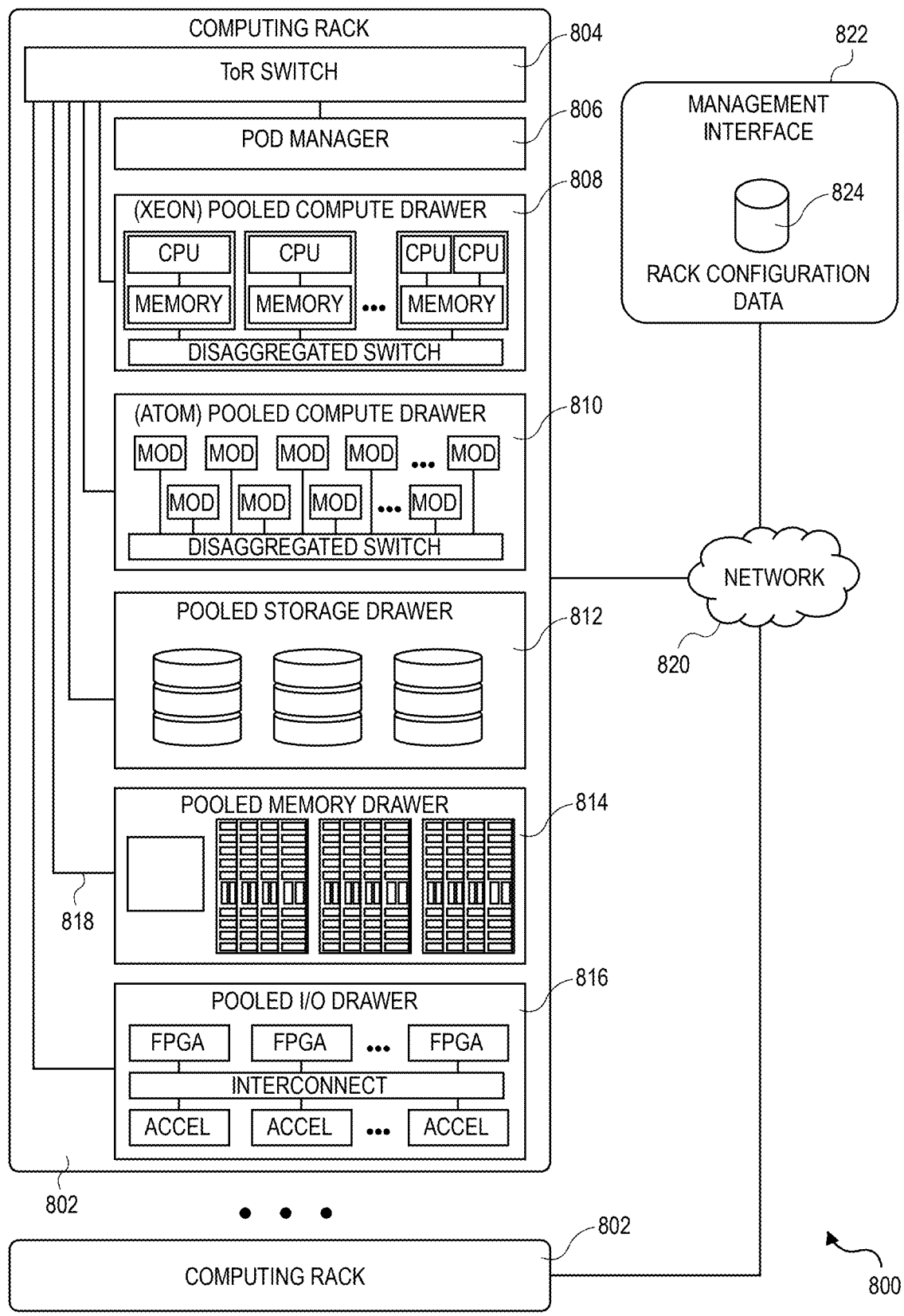
FIG. 8 depicts a rack.

The following discussion concerning FIGS. 6, 7, and 8 are directed to systems, data centers and rack implementations, generally. As such, FIG. 6 generally describes possible features of an electronic system that can be installed into a rack shelf having a back interface as described at length above. FIG. 7 describes possible features of a data center having racks of electronic equipment with back interfaces as described above. FIG. 8 describes possible features of a rack having a back interface as described above.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software functionality to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (ISCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 6, other types of systems to which the above described invention can be applied and are also partially or wholly described by FIG. 6 are communication systems such as routers, switches, and base stations.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to TOR switch 804 via a high-speed link 818, such as a 40 Gigabit/second (Gb/s) or 100 Gb/s Ethernet link or a 100+Gb/s Silicon Photonics (SiPh) optical link. In one embodiment high-speed link 818 comprises a 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their TOR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAS, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:
1. An apparatus,
a rack shelf back interface comprising:
   i) first and second flanges configured to mount the rack shelf back interface to rear facing rack mounts of a rack prior to insertion of electronic systems into shelfs of the rack;
   ii) a power connector on an inside of a back face of the rack shelf interface, the power connector to mate with a corresponding power connector on an electronic system that is to be installed in the rack shelf; and
   iii) a guide pin on the inside of the back face of the rack shelf interface, wherein the guide pin is configured to facilitate a proper mating of the power connector with the corresponding power connector.
2. The apparatus of claim 1 wherein a width of the guide pin expands moving from a tip of the guide pin toward the back face of the rack shelf back interface.
3. The apparatus of claim 2 wherein a width of an opening in the electronic system that is to mate with the guide pin lessens moving from a back of the electronic system to a front of the electronic system.
4. The apparatus of claim 1 wherein the rack shelf back interface further comprises:
   iv) a network connector on an inside of a back face of the rack shelf back interface, the network connector to mate with a corresponding network connector on the electronic system.
5. The apparatus of claim 1 wherein the rack shelf back interface further comprises:
   iv) a fluidic connector on an inside of a back face of the rack shelf back interface, the fluidic connector to mate with a corresponding fluidic connector on the electronic system.
6. The apparatus of claim 1 wherein the rack shelf back interface further comprises:
   ii) a second power connector on an inside of a second back face of the rack shelf back interface, the second power connector to mate with a second corresponding power connector on the electronic system.
7. An apparatus, comprising:
a rack comprising front facing mounts, rear facing mounts, rails defining different shelves of the rack, and a rack shelf back interface aligned with one of the shelves comprising:
   i) first and second flanges configured to mount the rack shelf back interface to the rear facing rack mounts at a location that corresponds to one of the shelves prior to insertion of an electronic system into the one of the shelfs;
   ii) a power connector on an inside of a back face of the rack shelf back interface, the power connector to mate with a corresponding power connector on the electronic system that is to be inserted in the rack shelf, the power connector coupled to a power cord that is connected to a power bus within the rack; and
   iii) a guide pin on the inside of the back face of the rack shelf back interface, wherein the guide pin is configured to facilitate a proper mating of the power connector with the corresponding power connector.
8. The apparatus of claim 7 wherein a width of the guide pin expands moving from a tip of the guide pin toward the back face of the rack shelf back interface.
9. The apparatus of claim 8 wherein a width of an opening in the electronic system that is to mate with the guide pin lessens moving from a back of the electronic system to a front of the electronic system.
10. The apparatus of claim 7 wherein the rack shelf back interface further comprises:
   iv) a network connector on an inside of a back face of the rack shelf back interface, the network connector to mate with a corresponding network connector on the electronic system.
11. The apparatus of claim 7 wherein the rack shelf back interface further comprises:
   iv) a fluidic connector on an inside of a back face of the rack shelf back interface, the fluidic connector to mate with a corresponding fluidic connector on the electronic system.
12. The apparatus of claim 7 wherein the rack shelf back interface further comprises:
   ii) a second power connector on an inside of a second back face of the rack shelf back interface, the second power connector to mate with a second corresponding power connector on the electronic system.
13. A data center, comprising:
a plurality of electronic systems installed into a plurality of racks, the plurality of electronic systems communicatively coupled to one another by way of one or more communication networks, wherein at least one of the racks comprises front facing mounts, rear facing mounts, rails defining different shelves of the rack, one of the electronic systems installed on one of the shelves and a rack shelf back interface aligned with the shelf comprising:
   i) first and second flanges configured to mount the rack shelf back interface to the rear facing rack mounts at a location that corresponds to the shelf prior to insertion of an electronic system into the shelf;
   ii) a power connector on an inside of a back face of the rack shelf back interface, the power connector connected to a corresponding power connector on the electronic system, the power connector coupled to a power cord that is connected to a power bus within the rack;
   iii) a guide pin on the inside of the back face of the rack shelf back interface, wherein the guide pin is configured to facilitate a proper mating of the power connector with the corresponding power connector; and
   iv) a network connector on an inside of a back face of the rack shelf back interface, the network connector mated with a corresponding network connector on the electronic system.
14. The data center of claim 13 wherein a width of the guide pin expands moving from a tip of the guide pin toward the back face of the rack shelf back interface.
15. The data center of claim 14 wherein a width of an opening in the electronic system that is to mate with the guide pin lessens moving from a back of the electronic system to a front of the electronic system.
16. The data center of claim 13 wherein the rack shelf back interface further comprises:
   v) a fluidic connector on an inside of a back face of the rack shelf back interface, the fluidic connector mated with a corresponding fluidic connector on the electronic system.
17. The data center of claim 14 wherein a width of the guide pin expands moving from a tip of the guide pin toward the back face of the rack shelf back interface, and wherein a width of an opening in the electronic system that is to mate with the guide pin lessens moving from a back of the electronic system to a front of the electronic system.

\* \* \* \* \*